US012581603B2

(12) United States Patent
Wang

(10) Patent No.: US 12,581,603 B2
(45) Date of Patent: Mar. 17, 2026

(54) SUPPORTING PLATE AND FOLDABLE DISPLAY MODULE

(71) Applicant: Wuhan China Star Optoelectronics Semiconductor Display Technology Co., Ltd., Wuhan (CN)

(72) Inventor: Wenqiang Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 672 days.

(21) Appl. No.: 17/294,436

(22) PCT Filed: Mar. 30, 2021

(86) PCT No.: PCT/CN2021/083809
§ 371 (c)(1),
(2) Date: Nov. 16, 2023

(87) PCT Pub. No.: WO2022/188215
PCT Pub. Date: Sep. 15, 2022

(65) Prior Publication Data
US 2024/0081003 A1 Mar. 7, 2024

(30) Foreign Application Priority Data
Mar. 9, 2021 (CN) .......................... 202110256900.2

(51) Int. Cl.
*H05K 5/02* (2006.01)

(52) U.S. Cl.
CPC .................................. *H05K 5/0217* (2013.01)

(58) Field of Classification Search
CPC ........................... H05K 5/0017; H05K 5/0217
USPC .......................................................... 361/807
See application file for complete search history.

(56) References Cited

U.S. PATENT DOCUMENTS

2017/0294495 A1* 10/2017 Shyu .................... H10K 59/131
2018/0097197 A1 4/2018 Han et al.
2019/0132987 A1* 5/2019 Koo .......................... H05K 7/18
2020/0273379 A1 8/2020 Wang et al.
2020/0319672 A1 10/2020 Kim et al.

FOREIGN PATENT DOCUMENTS

| CN | 110062077 | 7/2019 |
| CN | 110992828 | 4/2020 |
| CN | 111316344 | 6/2020 |
| CN | 111508357 | 8/2020 |
| CN | 211604573 | 9/2020 |
| CN | 211742521 | 10/2020 |
| CN | 211928943 | 11/2020 |

(Continued)

*Primary Examiner* — Hung S. Bui

(57) ABSTRACT

A supporting plate and a foldable display module are provided. The supporting plate has a bending region and non-bending regions. The bending region includes joint regions and semi-etching regions. A plurality of hollow structures are defined on a part of the supporting plate corresponding to the joint regions. A plurality of groove structures are defined on a part of the supporting plate corresponding to the semi-etching regions. In this way, stress received by a part of the flexible display panel corresponding to the semi-etching regions is reduced, and a risk of films peeling in the semi-etching regions of the foldable display module is reduced.

18 Claims, 7 Drawing Sheets

(56)          References Cited

FOREIGN PATENT DOCUMENTS

| CN | 112150926 | 12/2020 |
|----|-----------|---------|
| CN | 112164317 | 1/2021 |
| CN | 112289750 | 1/2021 |
| CN | 110767096 | 2/2021 |
| CN | 112309996 | 2/2021 |
| CN | 112435578 | 3/2021 |
| CN | 112436039 | 3/2021 |
| WO | WO 2019/182380 | 9/2019 |

* cited by examiner

120

128

127

126

125

100

101

130

SUPPORTING PLATE AND FOLDABLE DISPLAY MODULE

RELATED APPLICATIONS

This application is a National Phase of PCT Patent Application No. PCT/CN2021/083809 having International filing date of Mar. 30, 2021, which claims the benefit of priority of Chinese Patent Application No. 202110256900.2 filed on Mar. 9, 2021. The contents of the above applications are all incorporated by reference as if fully set forth herein in their entirety.

FIELD AND BACKGROUND OF THE INVENTION

The present disclosure relates to the field of display and particularly to a supporting plate and a foldable display module.

Organic light emitting diode (OLED) display technology can independently emit light without a backlight. Therefore, overall stacked thicknesses of OLED display modules are greatly reduced, and screens become more easily bent. With continuous breakthroughs in various OLED technologies, flexible displays have entered a commercialization stage. In recent years, various terminal manufacturers have successively launched foldable and rollable display electronic products, but high prices of which have caused product sales to fall short of expectations, and the commercial market for foldable mobile phones has not been quickly released. A main reason is that production yield rates of flexible OLED display panels are still at a low level, which directly leads to the prices of foldable display terminal products to be unable to be decreased. Wherein, phenomena such as peeling and fracture between film materials of the flexible OLED display modules frequently appear, which directly affects service life and production yield of products.

In order to ensure that OLED display modules have good overall flatness, a material adopted in a bottom layer of a stacked structure is generally a thin stainless steel (steel use stainless, SUS) plate, which acts as a module support layer. However, because elastic modulus of SUS in a form of an entire surface is obviously different from elastic modulus of film layers of a module material and the optically clear adhesive (OCA) layer, and the SUS is not easily deformed during a bending process, and especially not easily deformed during folding bending sections. Therefore, a phenomenon of uncoordinated force and deformation between film layers are usually present during folding processes, resulting in phenomena of peeling and fracture between the film layers. In view of the above, in order to improve the failure phenomenon, bending regions of the SUS in the form of an entire surface is generally designed as a structural form having hollow patterns to reduce bending rigidity of the SUS in the bending regions of the modules to improve the foldability of the modules. However, regarding OLED display modules in teardrop-shaped bending states, these bending states have two bending sections of inward bending and outward bending, and standard patterning on the SUS cannot effectively solve a problem of film peeling occurring in a bending transition region where a non-bending region transits toward a bending region.

In summary, current foldable display modules have a problem that the film layers are prone to peeling in the transition region where the non-bending region transits toward the bending region. Therefore, a supporting plate and a foldable display module need to be provided to remedy the defect.

SUMMARY OF THE INVENTION

The present disclosure provides a supporting plate and a foldable display module to solve the problem that the film layer is prone to peeling in the transition region where the non-bending region transits toward the bending region in current foldable display modules.

One embodiment of the present disclosure provides supporting plate configured to support a flexible display panel. The supporting plate has at least one bending region and non-bending regions connected to the bending region. Each bending region is connected between two opposite non-bending regions. The bending regions include:

joint regions, wherein the joint regions have a symmetrically central line; a plurality hollow structures in strip shapes penetrating the supporting plate are defined on a part where the supporting plate corresponds to the joint regions, the joint regions located on any side of the symmetrically central line include a plurality of sub-joint regions arranged sequentially along a direction away from the symmetrically central line; and at least one of sizes of the hollow structures in the different sub-joint regions, distances between adjacent hollow structures in a direction parallel to the symmetrically central line, or distances between the hollow structures close to the supporting plate and at an edge of any side perpendicular to the symmetrically central line and an edge of a corresponding side on the supporting plate are different; and two semi-etching regions respectively disposed between the joint regions and two opposite non-bending regions, wherein a plurality of groove structures not penetrating the supporting plate are defined on a lateral surface of a part of the supporting plate corresponding to the semi-etching regions.

According to one embodiment of the present disclosure, a length direction of the plurality of hollow structures is parallel to the symmetrically central line; a width direction of the plurality of hollow structures is perpendicular to the symmetrically central line;

at least two adjacent hollow structures are defined side by side in the direction parallel to the symmetrically central line; and two adjacent hollow structures are defined in a staggered manner in the direction perpendicular to the symmetrically central line.

According to one embodiment of the present disclosure, the hollow structures include:

a plurality of middle hollow structures defined between the supporting plate and two opposite lateral edges perpendicular to the symmetrically central line; and a plurality of edge hollow structures defined on a side of edges of part of the middle hollow structures close to the supporting plate and perpendicular to the symmetrically central line and penetrating an edge of the supporting plate in a thickness direction of the supporting plate.

According to one embodiment of the present disclosure, in any two adjacent sub-joint regions located on a same side of the symmetrically central line, lengths of the plurality of middle hollow structures in the sub-joint regions close to the symmetrically central line are greater than lengths of the plurality of middle hollow structures in the sub-joint region away from the symmetrically central line.

According to one embodiment of the present disclosure, lengths of the plurality of middle hollow structures in one same sub-joint regions are same.

According to one embodiment of the present disclosure, ratios between the lengths of the middle hollow structures located in any two adjacent sub-joint regions of the same side are greater than or equal to 2 and less than or equal to 3.

According to one embodiment of the present disclosure, in the direction parallel to the symmetrically central line, lengths of the edge hollow structures are greater than or equal to lengths of adjacent middle hollow structures.

According to one embodiment of the present disclosure, in any two adjacent sub-joint regions located on a same side of the symmetrically central line, the lengths of the plurality of edge hollow structures in the sub-joint region close to the symmetrically central line are greater than or equal to the lengths of the plurality of edge hollow structures in the sub-joint region away from the symmetrically central line.

According to one embodiment of the present disclosure, the joint regions located on any side of the symmetrically central line include a first sub-joint region, a second sub-joint region, a third sub-joint region, and a fourth sub-joint region sequentially arranged along the direction away from the symmetrically central line, wherein:

the lengths of the edge hollow structures are equal to the lengths of the middle hollow structures in the first sub-joint region;

the ratios of the lengths of the edge hollow structures to the lengths of the middle hollow structures are 2 in the second sub-joint region;

the ratios of the lengths of the edge hollow structures to the lengths of the middle hollow structures are 2 in the third sub-joint region; and the ratios of the lengths of the edge hollow structures to the lengths of the middle hollow structures are greater than or equal to 4 and less than or equal to 4.5 in the fourth sub-joint region.

According to one embodiment of the present disclosure, separation distances of any two hollow structures are equal in the direction parallel to the symmetrically central line.

According to one embodiment of the present disclosure, the separation distances of any two adjacent hollow structures are greater than or equal to 0.16 mm and less than or equal to 0.25 mm in the direction parallel to the symmetrically central line.

According to one embodiment of the present disclosure, in any two adjacent sub-joint regions located on a same side of the symmetrically central line, a distance between the middle hollow structures in the sub-joint regions close to the symmetrically central line and an edge of the supporting plate is longer than or equal to a distance between the middle hollow structures in the sub-joint regions away from the symmetrically central line and the edge of the supporting plate.

According to one embodiment of the present disclosure, the groove structures extend from an edge of a side of the supporting plate perpendicular to the symmetrically central line to an edge on other opposite side in the direction parallel to the symmetrically central line.

According to one embodiment of the present disclosure, depths of the plurality of groove structures located on a same side of the symmetrically central line gradually reduce in the direction away from the symmetrically central line.

According to one embodiment of the present disclosure, ratios of the depths of any two adjacent groove structures are greater than or equal to 1.2 and less than or equal to 1.5 in the direction away from the symmetrically central line.

According to one embodiment of the present disclosure, ratios of the depths of the plurality of groove structures to a thickness of the supporting plate are less than or equal to 0.6.

According to one embodiment of the present disclosure, in the direction away from the symmetrically central line, widths of the plurality of groove structures in the direction perpendicular to the symmetrically central line on a same side of the symmetrically central line are equal or gradually decreases.

According to one embodiment of the present disclosure, in the direction away from the symmetrically central line, ratios between the widths of any two adjacent groove structures in the direction perpendicular to the symmetrically central line are greater than or equal to 1 and less than or equal to 2.

According to one embodiment of the present disclosure, in the direction away from the symmetrically central line, distances between two adjacent groove structures are same or are gradually decreased.

According to one embodiment of the present disclosure, in the direction away from the symmetrically central line, ratios of the distances between two adjacent groove structures are greater than or equal to 1 and less or equal to 1.5.

One embodiment of the present disclosure provides a foldable display module, including:

a flexible display panel; and a supporting plate disposed on a backside of the flexible display panel, wherein the supporting plate has at least one bending region and non-bending regions connected to the bending region, each bending region is connected between two opposite non-bending regions, wherein the bending regions comprise:

joint regions, wherein the joint regions have a symmetrically central line; a plurality hollow structures in strip shapes penetrating the supporting plate are defined on a part where the supporting plate corresponds to the joint regions, the joint regions located on any side of the symmetrically central line comprise a plurality of sub-joint regions arranged sequentially along a direction away from the symmetrically central line; and at least one of sizes of the hollow structures in the different sub-joint regions, distances between adjacent hollow structures in a direction parallel to the symmetrically central line, or distances between the hollow structures close to the supporting plate and at an edge of any side perpendicular to the symmetrically central line and an edge of a corresponding side on the supporting plate are different; and two semi-etching regions respectively disposed between the joint regions and two opposite non-bending regions, wherein a plurality of groove structures not penetrating the supporting plate are defined on a lateral surface of a part of the supporting plate corresponding to the semi-etching regions, and wherein when the foldable flexible display panel is in a completely folded state, a part of the flexible display panel corresponding to the bending region forms a bending structure in a teardrop shape perpendicular to a cross section of the symmetrically central line; the bending structure includes an inner bending region and outer bending regions; the outer bending regions are located on two sides of the inner bending region and are connected to a part of the flexible display panel corresponding to the non-bending regions;

a part of the supporting plate corresponding to the inner bending region includes the plurality of sub-joint regions away from the semi-etching region; and a part of the supporting plate corresponding to the outer bending regions includes the plurality of sub-joint regions close to the semi-etching regions and the semi-etching regions.

According to one embodiment of the present disclosure, a length direction of the plurality of hollow structures is parallel to the symmetrically central line; a width direction of the plurality of hollow structures is perpendicular to the symmetrically central line;

at least two adjacent hollow structures are defined side by side in the direction parallel to the symmetrically central line; and two adjacent hollow structures are defined in a staggered manner in the direction perpendicular to the symmetrically central line.

According to one embodiment of the present disclosure, the hollow structures include:

a plurality of middle hollow structures defined between the supporting plate and two opposite lateral edges perpendicular to the symmetrically central line; and a plurality of edge hollow structures defined on a side of edges of part of the middle hollow structures close to the supporting plate and perpendicular to the symmetrically central line and penetrating an edge of the supporting plate in a thickness direction of the supporting plate.

According to one embodiment of the present disclosure, in any two adjacent sub-joint regions located on a same side of the symmetrically central line, lengths of the plurality of middle hollow structures in the sub-joint regions close to the symmetrically central line are greater than lengths of the plurality of middle hollow structures in the sub-joint region away from the symmetrically central line.

According to one embodiment of the present disclosure, lengths of the plurality of middle hollow structures in one same sub-joint regions are same.

According to one embodiment of the present disclosure, ratios between the lengths of the middle hollow structures located in any two adjacent sub-joint regions of the same side are greater than or equal to 2 and less than or equal to 3.

According to one embodiment of the present disclosure, in the direction parallel to the symmetrically central line, lengths of the edge hollow structures are greater than or equal to lengths of adjacent middle hollow structures.

According to one embodiment of the present disclosure, in any two adjacent sub-joint regions located on a same side of the symmetrically central line, the lengths of the plurality of edge hollow structures in the sub-joint region close to the symmetrically central line are greater than or equal to the lengths of the plurality of edge hollow structures in the sub-joint region away from the symmetrically central line.

According to one embodiment of the present disclosure, the joint regions located on any side of the symmetrically central line include a first sub-joint region, a second sub-joint region, a third sub-joint region, and a fourth sub-joint region sequentially arranged along the direction away from the symmetrically central line, wherein:

the lengths of the edge hollow structures are equal to the lengths of the middle hollow structures in the first sub-joint region;

the ratios of the lengths of the edge hollow structures to the lengths of the middle hollow structures are 2 in the second sub-joint region;

the ratios of the lengths of the edge hollow structures to the lengths of the middle hollow structures are 2 in the third sub-joint region; and the ratios of the lengths of the edge hollow structures to the lengths of the middle hollow structures are greater than or equal to 4 and less than or equal to 4.5 in the fourth sub-joint region.

According to one embodiment of the present disclosure, separation distances of any two hollow structures are equal in the direction parallel to the symmetrically central line.

According to one embodiment of the present disclosure, the separation distances of any two adjacent hollow structures are greater than or equal to 0.16 mm and less than or equal to 0.25 mm in the direction parallel to the symmetrically central line.

According to one embodiment of the present disclosure, in any two adjacent sub-joint regions located on a same side of the symmetrically central line, a distance between the middle hollow structures in the sub-joint regions close to the symmetrically central line and an edge of the supporting plate is longer than or equal to a distance between the middle hollow structures in the sub-joint regions away from the symmetrically central line and the edge of the supporting plate.

According to one embodiment of the present disclosure, the groove structures extend from an edge of a side of the supporting plate perpendicular to the symmetrically central line to an edge on other opposite side in the direction parallel to the symmetrically central line.

According to one embodiment of the present disclosure, depths of the plurality of groove structures located on a same side of the symmetrically central line gradually reduce in the direction away from the symmetrically central line.

According to one embodiment of the present disclosure, ratios of the depths of any two adjacent groove structures are greater than or equal to 1.2 and less than or equal to 1.5 in the direction away from the symmetrically central line.

According to one embodiment of the present disclosure, ratios of the depths of the plurality of groove structures to a thickness of the supporting plate are less than or equal to 0.6.

According to one embodiment of the present disclosure, in the direction away from the symmetrically central line, widths of the plurality of groove structures in the direction perpendicular to the symmetrically central line on a same side of the symmetrically central line are equal or gradually decreases.

According to one embodiment of the present disclosure, in the direction away from the symmetrically central line, ratios between the widths of any two adjacent groove structures in the direction perpendicular to the symmetrically central line are greater than or equal to 1 and less than or equal to 2.

According to one embodiment of the present disclosure, in the direction away from the symmetrically central line, distances between two adjacent groove structures are same or are gradually decreased.

According to one embodiment of the present disclosure, in the direction away from the symmetrically central line, ratios of the distances between two adjacent groove structures are greater than or equal to 1 and less than or equal to 1.5.

According to one embodiment of the present disclosure, when the foldable flexible display panel is in the completely folded state, in the plurality of sub-joint regions corresponding to the inner bending region, radii of curvature of the sub-joint regions close to the semi-etching regions are greater than or equal to radii of curvature of the sub-joint regions away from the semi-etching regions; and in the plurality of sub-joint regions corresponding to the outer bending regions, radii of curvature of the sub-joint regions close to the semi-etching regions are greater than radii of curvature of the sub-joint regions away from the semi-etching regions.

According to one embodiment of the present disclosure, the inner bending region includes a first inner bending section and a second inner bending section; the outer bending regions include first outer bending sections, second outer bending sections, and third outer bending sections; the first inner bending section and the second inner bending section correspond to the first sub-joint region and the second sub-joint region one-to-one respectively; the first outer bending sections, the second outer bending sections, and the third outer bending sections respectively correspond to the third sub-joint region, the fourth sub-joint region, and the semi-etching regions one-to-one respectively, and wherein:

a radius of curvature of the first sub-joint region is 4 mm;

a radius of curvature of the second sub-joint region is greater than or equal to 4 mm and less than or equal to 6 mm;

a radius of curvature of the third sub-joint region is greater than or equal to 12 mm and less than or equal to 15 mm;

a radius of curvature of the fourth sub-joint region is greater than or equal to 21 mm and less than or equal to 25 mm; and radii of curvature of the semi-etching regions are greater than or equal to 32 mm and less than or equal to 36 mm.

According to one embodiment of the present disclosure, the foldable display module further includes a buffer foam layer disposed between the flexible display panel and the supporting plate, and a protective layer disposed on a side of the supporting plate away from the flexible display panel and at least covering the bending region, wherein the flexible display panel includes a display substrate and a display device layer, a polarizer sheet, an optical clear adhesive layer, and a module protective layer sequentially laminated on the display substrate.

Beneficial effects of embodiments of the present disclosure: The embodiments of the present disclosure provide the supporting plate and the foldable display module. The supporting plate is configured to support a flexible display panel. The supporting plate has at least one bending region and non-bending regions connected to the bending region. Each bending region is connected between two opposite non-bending regions. The bending regions include the joint regions and the two semi-etching regions. The joint regions have the symmetrically central line. The plurality hollow structures in strip shapes penetrating the supporting plate are defined on the part where the supporting plate corresponds to the joint regions. The joint regions located on any side of the symmetrically central line include a plurality of sub-joint regions arranged sequentially along a direction away from the symmetrically central line.

At least one of sizes of the hollow structures in the different sub-joint regions, distances between adjacent hollow structures in a direction parallel to the symmetrically central line, or distances between the hollow structures close to the supporting plate and at an edge of any side perpendicular to the symmetrically central line and an edge of a corresponding side on the supporting plate are different.

Controlling at least one of the sizes of the hollow structure in the joint region, the distances from the edge of the supporting plate, and the distances between adjacent hollow structures by the above, the elastic tensile modulus of each sub-joint region presents regional changes. Therefore, the bending ductility and fatigue resistance of the part of the supporting plate corresponding to the joint region is improved, and difference in the radius of curvature of each sub-joint region in the completely folded state of the supporting plate is reduce, so that the transition of each sub-joint region is made to be smooth, and the overall arc of the joint region is more continuous. The two semi-etching regions are respectively disposed between the joint regions and two opposite non-bending regions. The plurality of groove structures not penetrating the supporting plate are defined on a lateral surface of a part of the supporting plate corresponding to the semi-etching regions. By defining the plurality of groove structures in the semi-etching regions, the bending modulus of the part of the supporting plate corresponding to the semi-etching regions is smaller than the bending modulus of the part of the supporting plate corresponding to the joint regions, thereby reducing difference between the radius of curvature of the part of the supporting plate corresponding to the semi-etching regions in the completely folded state and the radius of curvature of the adjacent sub-joint regions, making the arc from the joint regions to the semi-etching regions more continuous and transition on the supporting plate from the joint region to the non-bending region more smoother. Therefore, the received stress of the part the flexible display panel corresponding to the semi-etching regions is reduced, and the risk of films peeling in the semi-etching regions of the foldable display module is reduced.

BRIEF DESCRIPTION OF THE SEVERAL VIEWS OF THE DRAWINGS

To more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which those skilled in the art can derive further figures without making any inventive efforts.

DESCRIPTION OF SPECIFIC EMBODIMENTS OF THE INVENTION

The descriptions of embodiments below refer to accompanying drawings in order to illustrate certain embodiments which the present disclosure can implement. The directional terms of which the present disclosure mentions, for example, "top", "bottom", "upper", "lower", "front", "rear", "left", "right", "inside", "outside", "side", etc., are only refer to directions of the accompanying figures. Therefore, the used directional terms are for illustrating and understanding the present disclosure, but not for limiting the present disclosure. In the figures, units with similar structures are used same labels to indicate.

The present disclosure will be further described in detail below in combination with the drawings and specific embodiments.

Figure 1:
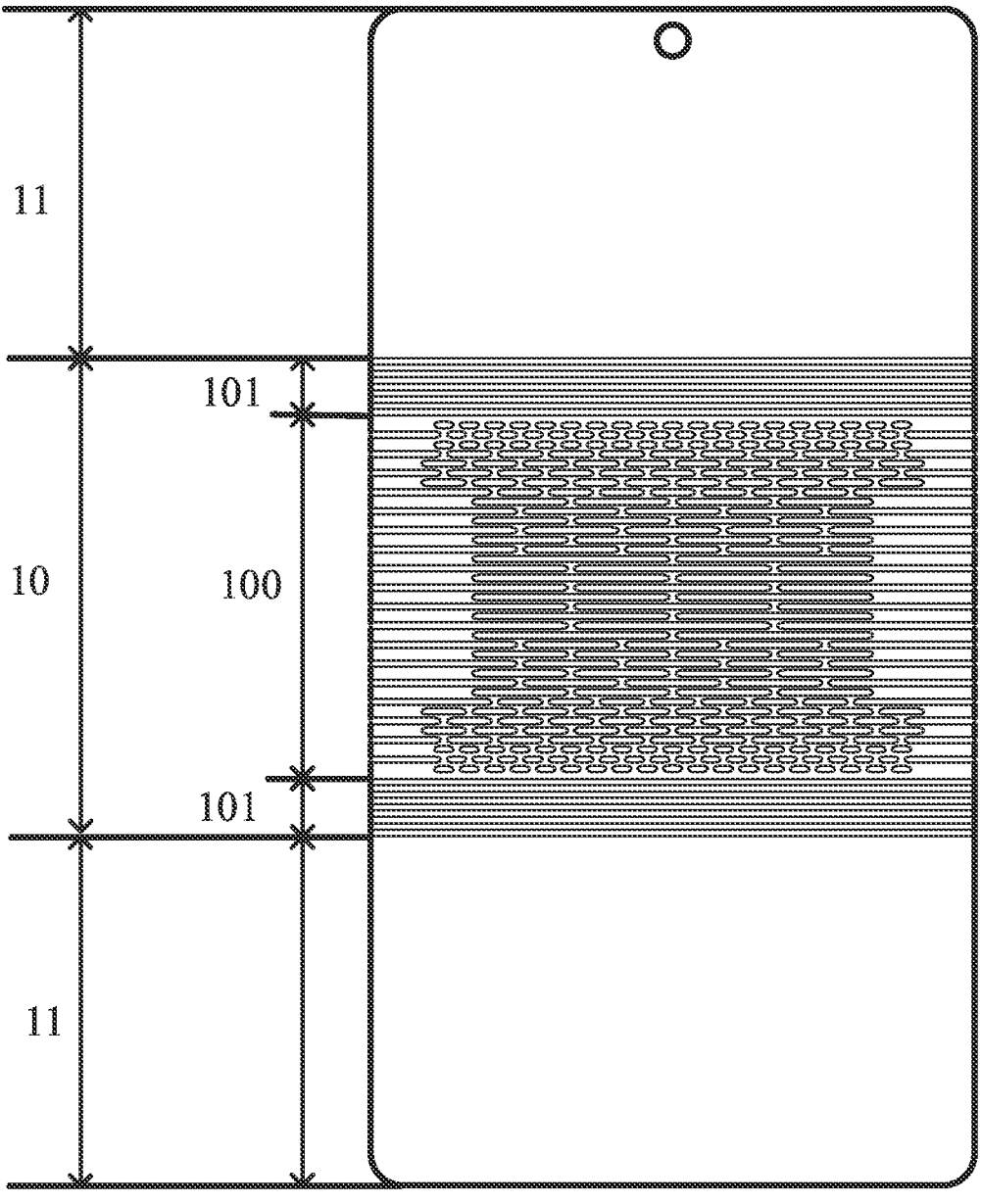
FIG. 1 is a structural schematic diagram of a supporting plate provided by one embodiment of the present disclosure.

One embodiment of the present disclosure provides a supporting plate. The supporting plate is configured to support a foldable flexible display panel. Please refer to FIG. 1. FIG. 1 is a structural schematic diagram of a supporting plate provided by one embodiment of the present disclosure. The supporting plate has at least one bending region 10 and non-bending regions 11 connected to the bending region 10. Each bending region is connected between two opposite non-bending regions 11.

It should be noted that a positional relationship of the bending region 10 and the plurality of non-bending regions 11 illustrated in FIG. 1 is only for description. The supporting plate illustrated in FIG. 1 includes one bending region 10 and two oppositely disposed non-bending regions 11. In practical applications, a number of the bending region 10 of the supporting plate can be selected according to requirements, and it is not limited to the number of the bending regions 10 illustrated in the above-mentioned FIG. 1. The number of the bending regions 10 can also be two or more.

In one embodiment of the present disclosure, a material of the supporting plate is a high-strength special thin steel plate mainly containing manganese, whose unit yield limit is not less than 1600 MPa and has good toughness and strength. In practical applications, a material of the support plate can be selected according to requirements and is not limited to the above-mentioned steel plate mainly containing manganese, but also be materials such as copper-based composite materials, titanium alloys, or high-strength magnesium-aluminum alloys.

In one embodiment of the present disclosure, a thickness of the supporting plate is 150 μm. In practical applications, the thickness of the supporting plate can be selected according to requirements, and it is not limited to 150 μm as mentioned previously, but it can also be 100 μm, 125 μm, 175 μm, or 200 μm, etc. as long as it ranges from 100 μm to 200 μm.

Figure 2:
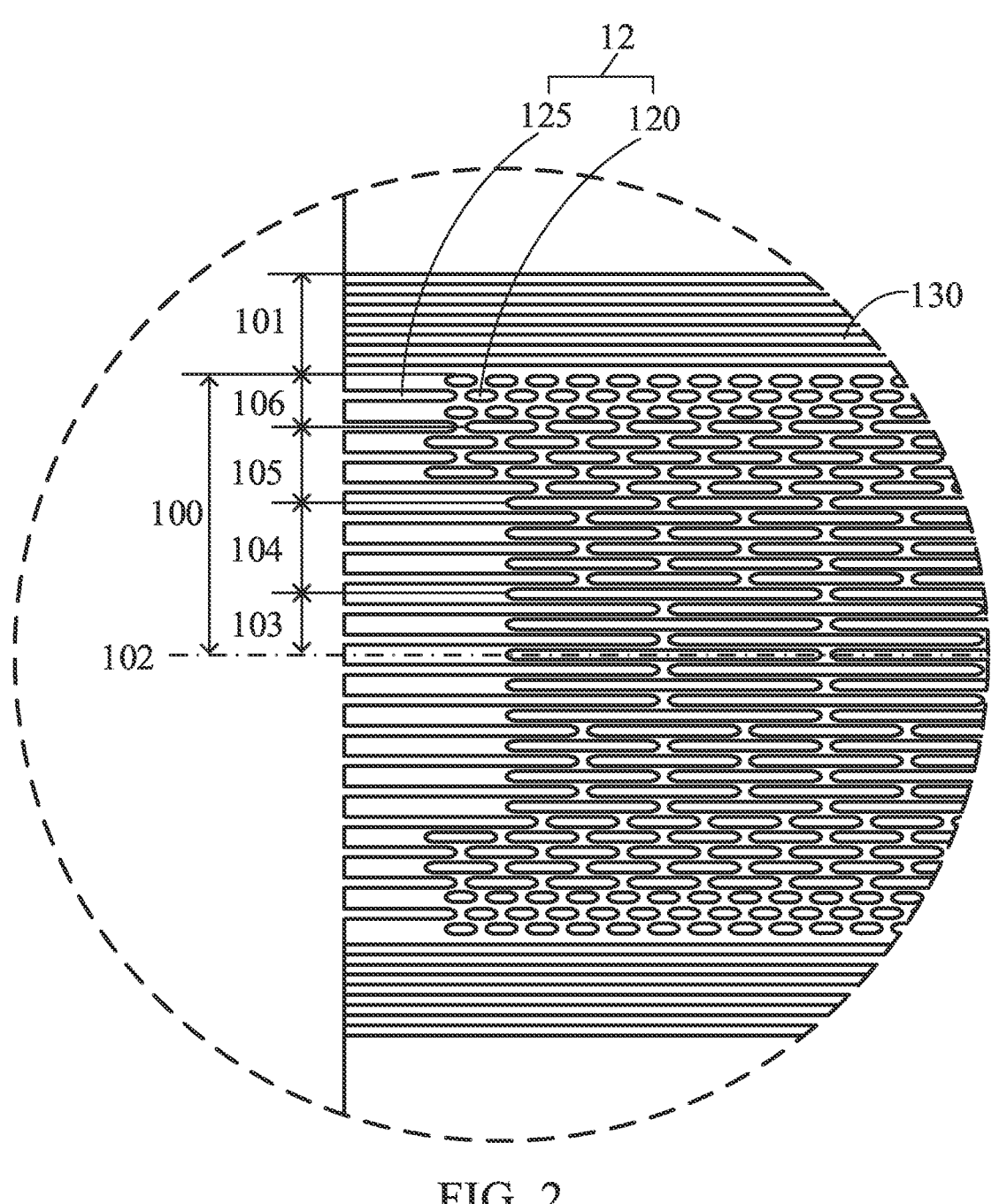
FIG. 2 is a partial schematic diagram of a bending region provided by one embodiment of the present disclosure.

Please refer to FIG. 1 and FIG. 2. FIG. 2 is a partial schematic diagram of the bending region provided by one embodiment of the present disclosure. The bending region 10 includes joint regions 100 and two semi-etching regions 101. The two semi-etching regions 101 are respectively disposed between the joint regions 100 and the two opposite non-bending regions 11. The joint regions 100 have a symmetrically central line 102. The joint regions 100 are symmetrical about the symmetrically central line 102. The joint regions 100 and the semi-etching regions 101 and the non-bending regions 11 located on both sides of the joint regions 100 can be folded or unfolded around the symmetrically central line 102.

A plurality of hollow structures 12 in strip shapes are defined on a part where the supporting plate corresponds to the joint regions 100. The hollow structures 12 penetrate the supporting plate in a thickness direction of the supporting plate. The joint regions 100 located on any side of the symmetrically central line 102 include a plurality of sub-joint regions arranged sequentially along a direction away from the symmetrically central line 102. At least one of a size of the hollow structures 12 in different sub-joint regions, a distance between adjacent hollow structures in a direction parallel to the symmetrically central line 12, or a distance between the hollow structures 12 close to the supporting plate and at an edge of any side perpendicular to the symmetrically central line 102 and an edge of a corresponding side on the supporting plate is different.

The hollow design of the hollow structures 12 can reduce rigidity of a part of the supporting plate corresponding to the joint regions 100. Using the plurality of hollow structures 12 to form accumulated deformation during the bending process of the supporting plate can make the part of the supporting plate corresponding to the joint regions 100 have a certain bendability and ductility. By controlling at least one of the sizes of the hollow structures 12 in each of the joint regions, the distances from the edge of the supporting plate, and the distances between adjacent hollow structures 12, the elastic tensile modulus of each sub-joint region presents regional changes. Therefore, the bending ductility and fatigue resistance of the part of the supporting plate corresponding to the joint regions 100 is improved, and difference in a radius of curvature of each sub-joint region in the completely folded state of the supporting plate is reduced, so that the transition of each sub-joint region of the joint regions is made to be smooth. Therefore, stress applied on the flexible display panel from the part of the supporting plate corresponding to the joint regions 100 is reduced, and the risk of film peeling or fragmentation of the flexible display panel is prevented.

The plurality of hollow structures 130 in strip shapes not penetrating the supporting plate are defined on the part where the supporting plate corresponds to the semi-etching regions 101. The plurality of groove structures 130 do not penetrate the supporting plate in the thickness direction of the supporting plate.

A hollow part of the hollow structures 130 can reduce a stress concentration coefficient of a part of the supporting plate corresponding to the semi-etching regions 101. The groove structures 130 not penetrating the supporting plate can also make a rigidity of the part of the supporting plate corresponding to the semi-etching regions 101 greater than the rigidity of the part corresponding to the joint regions 100. A bending modulus of the part of the supporting plate corresponding to the semi-etching regions 101 is smaller than a bending modulus of the part of the corresponding to the joint regions, thereby reducing difference between the radius of curvature of the part of the supporting plate corresponding to the semi-etching regions 101 in the completely folded state and the radius of curvature of the adjacent sub-joint regions, making the arc from the joint regions to the semi-etching regions 101 more continuous and transition on the supporting plate from the joint region to the non-bending region 11 more smoother. Therefore, the received stress of the part the flexible display panel corresponding to the semi-etching regions 101 is reduced, and the risk of films peeling in the semi-etching regions of the foldable display module is reduced.

A lateral surface not defined with the groove structure 130 can be configured to support the flexible display panel, so that the flatness of the surface of the flexible display panel can be ensured.

In one embodiment of the present disclosure, please refer to FIG. 1. A length direction of the plurality of hollow structures 12 is parallel to the symmetrically central line 102. A width direction of the plurality of hollow structures 12 is perpendicular to the symmetrically central line 102. The plurality of hollow structures 12 are symmetrically defined about the symmetrically central line 102. At least two adjacent hollow structures 12 are defined side by side in the direction parallel to the symmetrically central line 102. The plurality of hollow structures 12 arranged side by side constitute a row of the hollow structures 12. Numbers of the hollow structures 12 contained in two adjacent rows of the hollow structures 12 are different. Two adjacent hollow structures 12 are defined in a staggered manner in a direction perpendicular to the symmetrically central line 102, and the distances between any two adjacent hollow structures 12 defined in the staggered manner are same.

The hollow structures 12 include a plurality of middle hollow structures 120 and a plurality of edge hollow structures 125. The plurality of middle hollow structures 120 are defined between the supporting plate and two opposite lateral edges perpendicular to the symmetrically central line 102. The plurality of edge hollow structures 125 are defined on a side of edges of part of the middle hollow structures 120 close to the supporting plate and perpendicular to the symmetrically central line 102 and penetrates an edge of the supporting plate in the thickness direction of the supporting plate.

Figure 3:
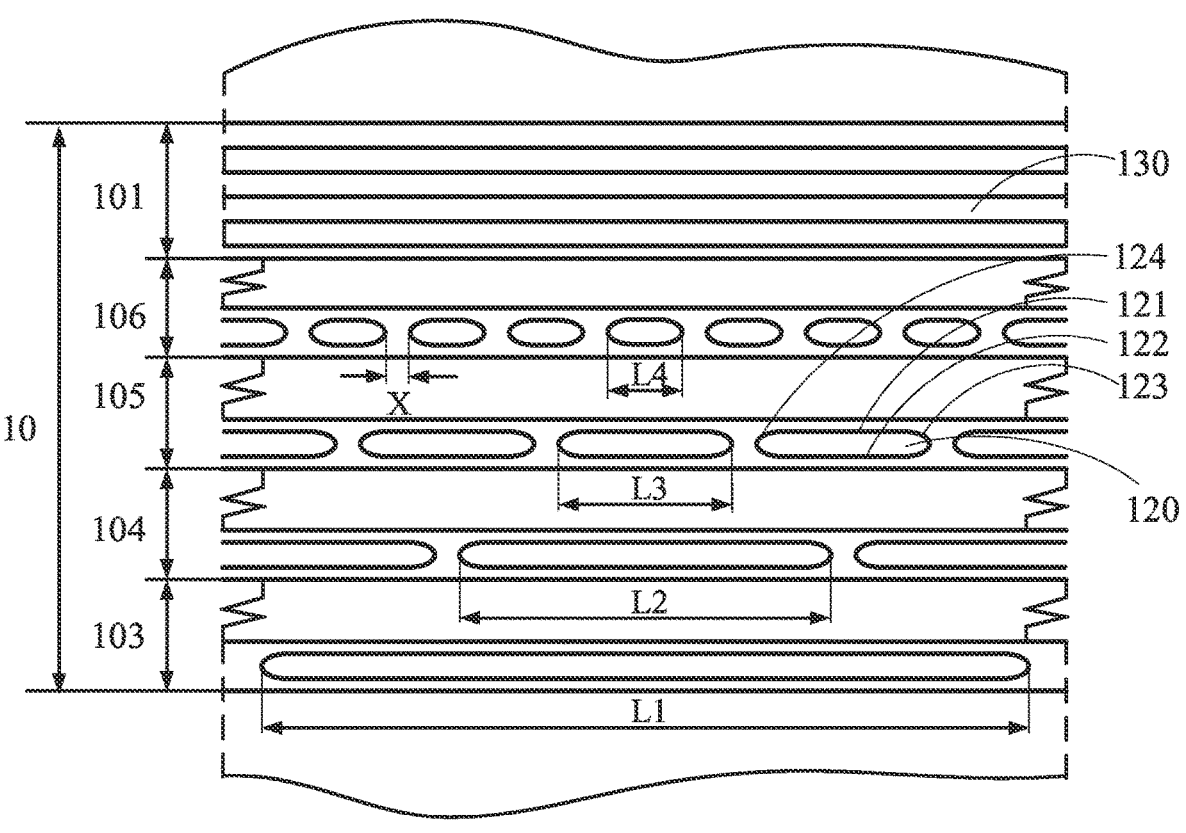
FIG. 3 is a partially enlarged schematic diagram of the bending region provided by one embodiment of the present disclosure.

FIG. 3 is a partially enlarged schematic diagram of the bending region provided by one embodiment of the present disclosure. Each of the strip-shaped middle hollow structures 120 includes a first straight line sector 121, a second straight line sector 122, a first arc line sector 123, and a second arc line sector 124. The first straight line sector 121 and the second straight line sector 122 are disposed oppositely parallel. Two ends of the first straight line sector 121 are respectively connected to two ends of the second straight line sectors 122 by the first arc line sector 123 and the second straight line sector 124. The first arc line sector 123 and the second straight line sector 124 are arc-shaped. In practical applications, the first straight line sectors 121 and the second straight line sectors 122 may also be replaced by adopting arc line sectors, curved line sectors with at least two curved parts, or a plurality of straight line sectors connected head-to-tail and disposed obliquely, and the first arc line sector 123 and the second arc line sector 124 can also be an elliptical arc.

Figure 4:
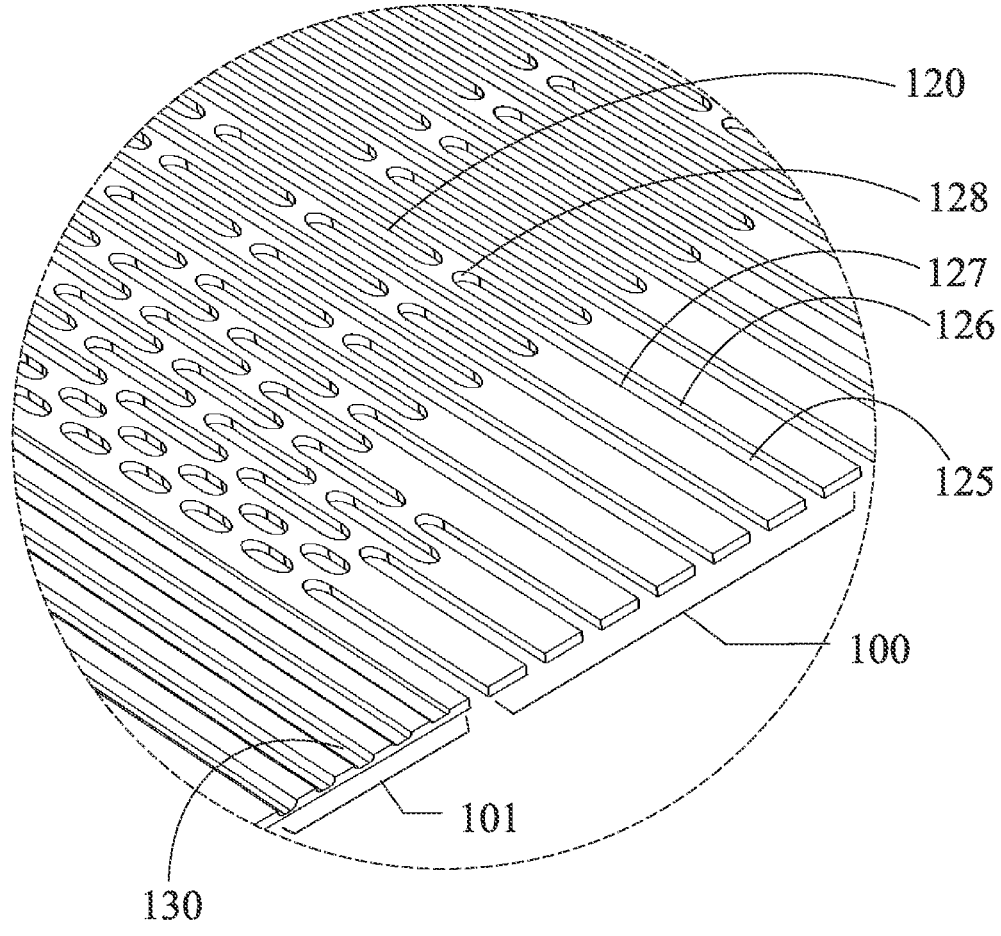
FIG. 4 is a partially enlarged schematic diagram of joint regions and semi-etching regions provided by one embodiment of the present disclosure.

FIG. 4 is a partially enlarged schematic diagram of joint regions and semi-etching regions provided by one embodiment of the present disclosure. Each of the strip-shaped edge hollow structures 125 includes a third straight line sector 126, a fourth straight line sector 127, and a third arc line sector 128. One end of the third straight line sector 126 is connected to one end of the fourth straight line sector 127 by the third arc line sector 128, and the third arc line sector 128 is an arc shape. Two symmetrically defined edge hollow structures 125 respectively located on the two edges of the part of the supporting plate corresponding to the joint regions 100 and a row of the middle hollow structures 120 including a relatively small number of the middle hollow structures 120 are defined side by side. An opening of each of the edge hollow structures 125 is away from an adjacent middle hollow structure 120.

In one embodiment of the present disclosure, depths of the plurality of groove structures 120 located on a same side of the symmetrically central line 102 gradually reduce in the direction away from the symmetrically central line 102. In this way, the bendability and ductility of the part of the supporting plate corresponding to the joint regions 100 can be reduced in a continuous gradient in the direction away from the symmetrically central line 102. Therefore, the bending ductility and fatigue resistance of the part of the supporting plate corresponding to the joint regions 100 is improved, and difference in the radius of curvature of each sub-joint region in the completely folded state of the supporting plate is reduced, so that the transition of each sub-joint region of the joint regions is made to be smooth. Therefore, stress applied on the flexible display panel from the part of the supporting plate corresponding to the joint regions 100 is reduced, and the risk of film peeling or fragmentation of the flexible display panel is prevented.

In any two adjacent sub-joint regions located on a same side of the symmetrically central line 102, lengths of the plurality of middle hollow structures 120 in the sub-joint regions close to the symmetrically central line 102 are greater than lengths of the plurality of middle hollow structures 120 in the sub-joint region away from the symmetrically central line 102.

Please refer to FIG. 2 and FIG. 3. The bending regions 10 located on an upper half section of the symmetrically central line 102 are taken as an example. The joint regions 100 located on the upper-half section of the symmetrically central line 102 include a first sub-joint region 103, a second sub-joint region 104, a third sub-joint region 105, and a fourth sub-joint region 106 sequentially arranged along the direction away from the symmetrically central line 102. The first sub-joint region 103 is connected to the first sub-joint region 103 located in a lower-half section of the symmetrically central line 102. The fourth sub-joint region 106 is connected to the semi-etching regions 101. Widths of the aforesaid four sub-joint regions can be same or also can be different. Specifically, approximate width values of each sub-joint regions can be calculated by finite element method.

In practical applications, a number of the sub-joint regions included by the joint regions 100 can be selected according to requirements, and it is not limited to 4 as mentioned above, it can also be a number of 2, 3, 5, or more.

In one embodiment of the present disclosure, lengths of the plurality of middle hollow structures 120 in one same sub-joint regions are same.

Specifically, please refer to FIG. 3. A width L2 of the middle hollow structure 120 in the second sub-joint region 104 is less than a width L1 of the middle hollow structure 120 in the first sub-joint region 103; a width L3 of the middle hollow structure 120 in the third sub-joint region 105 is less than a width L2 of the middle hollow structure 120 in the second sub-joint region 104; and a width L4 of the middle hollow structure 120 in the fourth sub-joint region 106 is less than a width L3 of the middle hollow structure 120 in the third sub-joint region 105, i.e., L4<L3<L2<L1.

The lengths of the middle hollow structures 120 are directly proportional to bendability and ductility of the supporting plate. The greater the lengths of the middle hollow structures 120 are, the better bendability and ductility of the supporting plate are, and a tensile modulus of the supporting plate is better. In this way, the bendability, the ductility, and the tensile modulus of the part of the supporting plate corresponding to the joint regions 100 can be reduced in a continuous gradient in the direction away from the symmetrically central line 102. Therefore, the bending ductility and fatigue resistance of the part of the supporting plate corresponding to the joint regions 100 is improved. Furthermore, in the completely folded state of the part of joint regions 100 corresponding to the supporting plate, the transition of each sub-joint region of the joint regions 100 is made to be smooth, and the overall arc of the joint regions 100 is more continuous. Therefore, stress applied on the flexible display panel from the part of the supporting plate corresponding to the joint regions 100 is reduced, and the risk of film peeling or fragmentation of the flexible display panel is prevented. In practical applications, the lengths of the plurality of middle hollow structures 120 located in the same sub-joint region may also be in a gradually decreasing trend in the direction away from the symmetrically central line 102.

Furthermore, the ratios between the lengths of the middle hollow structures 120 in any two adjacent sub-joint regions on the same side of the symmetrically central line 102 are greater than or equal to 2 and less than or equal to 3.

In one embodiment of the present disclosure, the ratios between the lengths of the middle hollow structures 120 in any two adjacent sub-joint regions located on any side of the symmetrically central line 102 is 2, i.e., $8L4=4L3=2L2=L1$. In practical applications, the ratios between the lengths of the middle hollow structures 120 of any two adjacent sub-joint regions located on any side of the symmetrically central line 102 can be selected according to requirements, and they are not limited to 2 as mentioned above, they can also be 2.3, 2.5, 2.8, or 3, etc., they only need to range from 2 to 3. Furthermore, the ratios between the lengths of the middle hollow structures 120 in any two adjacent sub-joint regions located on any side of the symmetrically central line 102 can be same or also can be different.

Specifically, in one embodiment of the present disclosure, the length L1 of the middle hollow structure 120 located in the first sub-joint region 103 is 6 mm; the length L2 of the middle hollow structure 120 located in the second sub-joint region 104 is 3 mm, the length L3 of the middle hollow structure 120 located in the third sub-joint region is 1.5 mm, and the length L4 of the middle hollow structure 120 located in the fourth sub-joint region 106 is 0.75 mm. In practical applications, the length of the middle hollow structure 120 in each sub-joint region can be selected according to practical requirements, and it is not limited to the aforesaid lengths.

In the direction parallel to the symmetrically central line 102, lengths of the edge hollow structures 125 are greater than or equal to lengths of adjacent middle hollow structures 120. In this way, ductility and tensile performance of an edge section of each sub-joint region can be better than or same as ductility and tensile performance of a middle section, so that the stress in each sub-joint region can be uniformly dispersed, and appearance of stress concentration at the edge of each sub-joint region, which can cause stress accumulation on the edge of the flexible display panel and result in situations of edge failure on the flexible display panel, can be avoided.

In one embodiment of the present disclosure, in the first sub-joint region 103, the lengths L5 of the edge hollow structures 125 are equal to the lengths L1 of the middle hollow structures 120, i.e. $L1=L5=6$ mm; in the second sub-joint region 104, a ratio of the lengths L6 of the edge hollow structures 125 to the lengths L2 of the middle hollow structures 120 is 2, i.e., $L6=2L2=6$ mm; in the third sub-joint region 105, a ratio of the lengths L7 of the edge hollow structures 125 to the lengths L3 of the middle hollow structures 120 is 2, i.e., $L7=2L3=3$ mm; and in the fourth sub-joint region 106, a ratio of the lengths L8 of the edge hollow structures 125 to the lengths L4 of the middle hollow structures 120 is 4, i.e., $L8=4L4=3$ mm.

In any two adjacent sub-joint regions located on a same side of the symmetrically central line 102, lengths of the plurality of edge hollow structures 125 in the sub-joint regions close to the symmetrically central line 102 are greater than or equal to lengths of the plurality of edge hollow structures 125 in the sub-joint region away from the symmetrically central line 102.

In one embodiment of the present disclosure, the length L5 of the edge hollow structure 125 in the first sub-joint region 103 is 6 mm, which is equal to the length L6 of 6 mm of the edge hollow structure 125 in the second sub-joint region 104 and is greater than the length L7 of the edge hollow structure 125 in the third sub-joint region 105; and the length L7 of the edge hollow structure 125 in the third sub-joint region 103 is 3 mm, which is equal to the length L8 of 3 mm of the edge hollow structure 125 in the fourth sub-joint region 106. In this way, ductility and tensile performance of the edge sections of the adjacent first sub-joint region 103 and second sub-joint region 104 and the adjacent third sub-joint region 105 and fourth sub-joint region 106 can be same or similar, so that the adjacent first sub-joint region 103 and second sub-joint region 104 and the adjacent third sub-joint region 105 and fourth sub-joint region 106 are uniformly stressed at the edge sections, preventing a zigzag phenomenon from occurring on each sub-joint region during bending, thereby reducing a risk of failure on the edge of the flexible display panel corresponding to the sub-joint regions 100.

In practical applications, the length L5 of the edge hollow structure 125 in the first sub-joint region 103 can also be configured to be greater than the length L6 of the edge hollow structure 125 in the second sub-joint region 104; and the length L7 of the edge hollow structure 125 in the third sub-joint region 105 can also be configured to be greater than the length L8 of the edge hollow structure 125 in the fourth sub-joint region 106. It only needs to ensure that the length L5 of the edge hollow structure 125 in the first sub-joint region 103 and the length L6 of the edge hollow structure 125 in the second sub-joint region 104 are in a same range, and the length L7 of the edge hollow structure 125 in the third sub-joint region 105 and the length L8 of the edge hollow structure 125 in the fourth sub-joint region 106 are in a same range.

Furthermore, separation distances of any two hollow structures 12 are equal in the direction parallel to the symmetrically central line 102. In this way, in one aspect, design and manufacture of the supporting plate can be facilitated, and in another aspect, the stress in each sub-joint region can be uniformly distributed, preventing appearance of fragmentation on the bending region 10 of the supporting plate incurred by stress concentration.

In one embodiment of the present disclosure, in the direction parallel to the symmetrically central line 102, the distance X between any two adjacent middle hollow structures 120 is 0.2 mm, and the distance between the edge hollow structure 125 and the adjacent middle hollow structure 120 is also 0.2 mm. In practical applications, the distance between any two adjacent hollow structures 12 can be selected according to a practical situation, and it is not limited to 2 mm as mentioned above, it can also be 0.16 mm, 0.18 mm, 0.22 mm or 0.25 mm, and it only needs to be greater than or equal to 0.16 mm and less than or equal to 0.25 mm.

Furthermore, in any two adjacent sub-joint regions located on a same side of the symmetrically central line 102, the distance between the middle hollow structure 120 in the sub-joint regions close to the symmetrically central line 120 and an edge of the supporting plate are longer than or equal to a distance between the middle hollow structure 120 in the sub-joint regions away from the symmetrically central line 102 and the edge of the supporting plate.

In one embodiment of the present disclosure, as illustrated in FIG. 2, compared with a plurality of rows of middle hollow structures 120 not defined with the edge hollow structures 125 in each sub-joint region, the distance between the middle hollow structures 120 close to the edge of one side of the supporting plate in the first sub-joint region 103 and the corresponding edge of the side on the supporting plate corresponding is equal to the distance between the middle hollow structure 120 in the middle hollow structure 104 and the edge of the supporting plate. The distance between the middle hollow structure 120 in the third sub-joint region 105 and the edge of the supporting plate is less than the middle hollow structure 120 in the second sub-joint region 104 and the edge of the supporting plate. The distance between the middle hollow structure 120 in the fourth sub-joint region and the edge of the supporting plate is equal to the middle hollow structure 120 in the third sub-joint region 105 and the edge of the supporting plate.

In this way, ductility and tensile performance of the edge sections of the adjacent first sub-joint region 103 and second sub-joint region 104 and the adjacent third sub-joint region 105 and fourth sub-joint region 106 can be same or similar, so that the adjacent first sub-joint region 103 and second sub-joint region 104 and the adjacent third sub-joint region 105 and fourth sub-joint region 106 are uniformly stressed at the edge sections, preventing the zigzag phenomenon from occurring on each sub-joint region during bending, thereby reducing the risk of failure on the edge of the flexible display panel corresponding to the sub-joint regions 100. In practical applications, from the first sub-joint region 103 to the fourth sub-joint region 106, the distance between the middle hollow structure 120 and the edge of the supporting plate gradually decreasing can also be limited.

Please refer to FIG. 3 and FIG. 4. In one embodiment of the present disclosure, in the direction parallel to the symmetrically central line 102, the groove structures 130 extend from an edge of a side of the supporting plate perpendicular to the symmetrically central line 102 to an edge on other opposite side. The groove structures 130 with straight-grooved structures can be formed by a semi-etching process, and the groove structures 130 do not penetrate the supporting plate in the thickness direction of the supporting plate. In this way, a stress concentration coefficient of the supporting plate corresponding to the part of the semi-etching regions 101 can be reduced, and the rigidity of the part of the supporting plate corresponding to the semi-etching regions 101 can also be greater than the rigidity of the part corresponding to the joint regions 100. Therefore, the bending from of the part of the supporting plate corresponding to the semi-etching regions 101 is changed, and the curvature of this part is reduced, thereby reducing the risk of film peeling of layers in the semi-etching regions 101 in the flexible display module.

Furthermore, depths of the plurality of groove structures 130 located on a same side of the symmetrically central line 102 gradually reduce in the direction away from the symmetrically central line 102. In this way, the bending modulus of the part of the supporting plate corresponding to the semi-etching regions 101 can be reduced in a continuous gradient, thereby increasing the radius of curvature of the part of the supporting plate corresponding to the semi-etching regions 101 in the completely folded state and reducing level of bending of the part of the supporting plate corresponding to the semi-etching regions 101, and change in the curvature is more continuous. Therefore, the bending state of the part of the supporting plate corresponding to the semi-etching regions 101 is changed, and a force state of a part of the flexible display panel corresponding to the semi-etching regions 101 is effectively eased, thereby reducing the risk of the flexible display panel peeling in the semi-etching regions, and a lateral surface not defined with the groove structures 130 can be configured to support the flexible display panel, so that flatness of the surface of the flexible display panel can be ensured.

Furthermore, ratios between the depths of any two adjacent groove structures 130 are greater than or equal to 1.2 and less than or equal to 1.5 in the direction away from the symmetrically central line 102.

Figure 5:
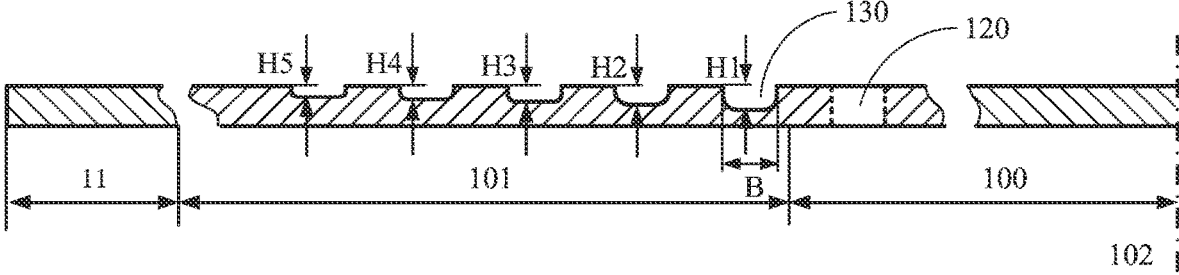
FIG. 5 is a partial cross-sectional schematic diagram of the supporting plate provided by one embodiment of the present disclosure.

Please refer to FIG. 5. FIG. 5 is a partial cross-sectional schematic diagram of the supporting plate provided by one embodiment of the present disclosure. In one embodiment of the present disclosure, the semi-etching regions 101 located on any side of the symmetrically central line 102 include five groove structures 130 defined in parallel and spaced apart in sequence. In the direction away from the symmetrically central line 102, depths of the five groove structures 103 in the thickness direction of the supporting plate are sequentially $H1$, $H2$, $H3$, $H4$, and $H5$, and $H1 > H2 > H3 > H4 > H5$. In this way, the bending modulus of the part of the support plate corresponding to the semi-etching regions 101 can be changed in a continuous gradient, and the part of the supporting plate corresponding to the semi-etching regions 101 is reduced, so that the force state of the supporting plate in the semi-etching regions 101 is effectively eased, and change in the curvature is more continuous and smooth, preventing sharp shapes as a result of bending from occurring on the part of the supporting plate corresponding to the semi-etching regions 101, thereby further reducing the risk of films peeling in the semi-etching regions of the foldable display module.

Specifically, in one embodiment of the present disclosure, in the direction away from the symmetrically central line 102, the ratios between the depths of any two adjacent groove are 1.5, i.e., $H1 = 1.5 H2$, $H2 = 1.5 H3$, $H3 = 1.5 H4$, and $H4 = 1.5 H5$. In practical applications, the ratios of the depths of any two adjacent groove structures 130 can be selected as requirements but are not limited to the 1.5 as mentioned above, they can also be 1.4, 1.3, or 1.2, etc. They only need to be greater than or equal to 1.2 and less than or equal to 1.5, and the ratios of the depths of any two adjacent groove structures 130 can be same or different.

It should be noted that the groove structures 130 in the supporting plate corresponding to the semi-etching region 101 is only illustrated in FIG. 5. A number of the groove structures 130 of each depth value is 1, but it does not represent the number of the groove structures 130 defined in the semi-etching regions 101 in practical applications. In practical applications, the number of groove structures 130 can be selected according to requirements, and it is not limited to 5 as mentioned above, it can also be more than 5. The number of the groove structures 130 of each depth value can also be 2 or more.

Furthermore, ratios of the depths of the plurality of groove structures 130 to a thickness of the supporting plate are less than or equal to 0.6. The bending rigidity of the supporting plate being proportional to the thickness of the supporting plate allows the groove structures 130 to have a certain rigidity while the groove structures 130 having a certain bendability is ensured. Therefore, the bending state of the flexible display module in a teardrop shape is controlled, and the risk of film peeling of layers in the semi-etching regions 101 in the flexible display module is reduced.

In one embodiment of the present disclosure, a maximum value of the depths of the groove structures 130 is $H1$, and a ratio of the value of H1 to the thickness of the supporting plate is 0.6. In practical applications, the maximum depth of the groove structures 130 can be selected according to practical requirements, it is not limited to 0.6 as mentioned above, and it can also be 0.5, 0.4, or 0.3, etc., which only needs to be less than or equal to 0.6.

In the direction away from the symmetrically central line 102, widths of the plurality of groove structures 130 in the direction perpendicular to the symmetrically central line 102 on a same side of the symmetrically central line are equal or gradually decreases.

Furthermore, in the direction away from the symmetrically central line, ratios between the widths of any two adjacent groove structures 130 in the direction perpendicular to the symmetrically central line 102 are greater than or equal to 1 and less than or equal to 2.

In one embodiment of the present disclosure, the ratio between widths B of any two adjacent groove structures 130 is 1, i.e., the width of each groove structure 130 is equal. Therefore, this is conducive to the processing and quality control in actual production processes. In several embodiments, the ratios between the widths of any two adjacent groove structures 130 also can be 2, i.e., the widths of the groove structures 130 gradually reduce in the direction away from the symmetrically central line 102. Therefore, the bending modulus of the semi-etching regions 101 of the supporting plate can also be made to change in a continuous gradient. In practical applications, the ratios between the widths of any two adjacent groove structures 130 can be selected according to requirements, and they are not limited to 1 or 2 as mentioned above, they also can be 1.3, 1.5, or 1.8, etc., and they only to be greater than or equal to 1 and less than or equal to 2.

In the direction away from the symmetrically central line 102, distances between two adjacent groove structures 130 are same or are gradually decreased.

Furthermore, ratios of the distances of any two adjacent groove structures 130 are greater than or equal to 1 and less than or equal to 1.5 in the direction away from the symmetrically central line 102.

In one embodiment of the present disclosure, the ratios of the distances of two adjacent groove structures 130 is 1, i.e., the distances of any two adjacent groove structures 130 are equal. Therefore, this is conducive to the processing and quality control in actual production processes. In practical applications, the ratios of the distances of two adjacent groove structures 130 are not limited to 1 as mentioned above, they also can be 1.2, 1.3, 1.4, or 1.5, etc., and they only to be greater than 1 or less than or equal to 1.5, i.e., in the direction away from the symmetrically central line 102, the distances between two adjacent groove structures 130 gradually increase, so that the bending modulus of the supporting plate in the semi-etching regions 101 decreases in a continuous gradient. Therefore, the bending state of the part of the supporting plate corresponding to the semi-etching regions 101 in the completely folded state is changed, and the curvature of the part of the supporting plate corresponding to the semi-etching regions 101 in the completely folded state is gradually reduced in the bending direction, thereby reducing the stress of the part of the supporting plate corresponding to the semi-etching regions 101 to the flexible display panel.

Figure 6:
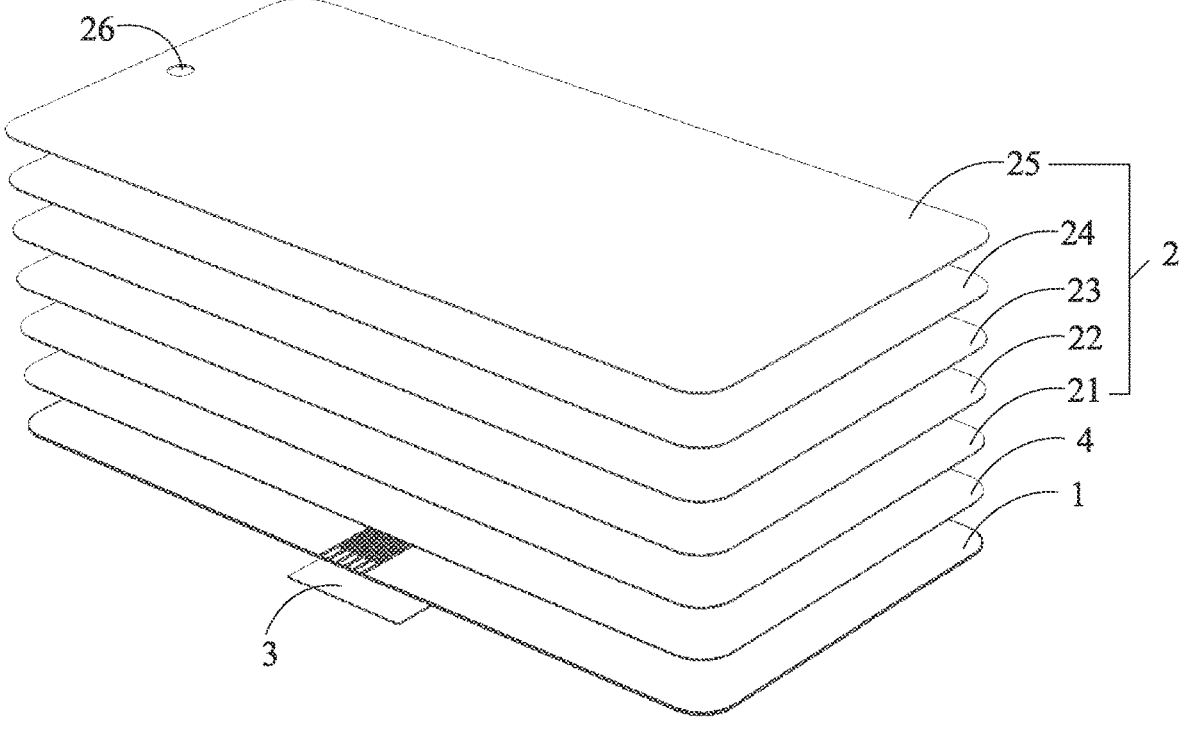
FIG. 6 is a structural schematic diagram of a foldable display module provided by one embodiment of the present disclosure.

One embodiment of the present disclosure further provides a foldable display module, which is described in detail with reference to FIG. 1 to FIG. 7. Please refer to FIG. 6, FIG. 6 is a structural schematic diagram of the foldable display module provided by one embodiment of the present disclosure. The foldable display module includes the flexible display panel 2 and the supporting plate 1. The supporting plate 1 is disposed on a backside of the flexible display panel 2 and is configured to support the flexible display panel 2. The supporting plate 1 is the supporting plate provided by the aforesaid embodiments, and the supporting plate 1 of the embodiments of the present disclosure can realize same technical effects of the supporting plate provided by the aforesaid embodiments. Redundant description will not be mentioned herein.

Figure 7:
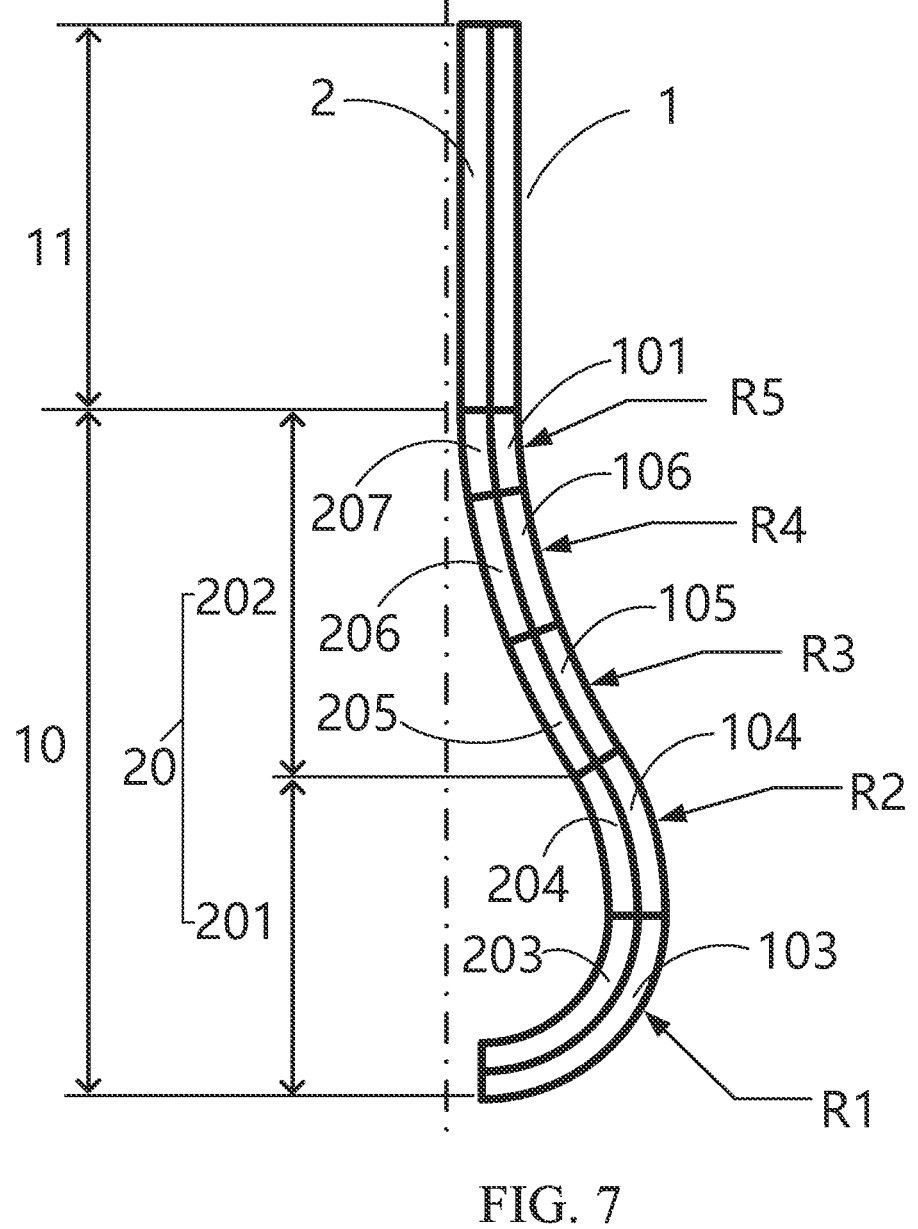
FIG. 7 is a structural schematic diagram of the foldable display module provided by one embodiment of the present disclosure in a completely folded state.

As illustrated in FIG. 7, FIG. 7 is a structural schematic diagram of the foldable display module provided by one embodiment of the present disclosure in the completely folded state. When the foldable display module is in the completely folded state, the part of the flexible display panel 2 corresponding to the bending region 10 is formed in a teardrop-shaped bending structure 20 perpendicular to a cross section of the symmetrically central line of the supporting plate. The bending structure 20 includes an inner bending region 201 and outer bending regions 202. Bending directions of the inner bending region 201 and the outer bending region 202 are opposite. The outer bending regions 202 are located on two sides of the inner bending region 201 and are connected to a part of the flexible display panel 2 corresponding to the non-bending regions 11. It should be noted that in FIG. 7, only a structure of a right side of the foldable display module in the completely folded state is illustrated, and a left side of the foldable display module is largely same as the structure of the right side illustrated in FIG. 7. Furthermore, in FIG. 7, only the flexible display 2 and the supporting plate 1 are illustrated, but a protective layer 3 and a buffer foam layer 4 are not illustrated. Redundant description will not be mentioned herein.

The part of the supporting plate 1 corresponding to the inner bending region 201 includes the plurality of sub-joint regions away from the semi-etching regions 101. A bending direction of the sub-joint regions corresponding to the inner bending region 210 is same as the bending direction of the inner bending region 201. The part of the supporting plate 1 corresponding to the outer bending region 202 includes the plurality of sub-joint regions close to the semi-etching regions 101 and the semi-etching regions 101. A bending direction of the plurality of sub-joint regions and the semi-etching regions 101 corresponding to the outer bending region 202 is same as the bending direction of the outer bending region 202.

In one embodiment of the present disclosure, as illustrated in FIG. 7, the first sub-joint region 103 and the second sub-joint region 104 both correspond to the inner bending region 201; the bending directions of the first sub-joint region 103 and the second sub-joint region 104 are same as the bending direction of the inner bending region 201; the third sub-joint region 105, the fourth sub-joint region 106, and the semi-etching regions 101 correspond to the outer bending region 202, and the bending directions of the third sub-joint region 105, the fourth sub-joint region 106, and the semi-etching regions 101 are same as the bending direction of the outer bending region 202.

Specifically, the inner bending region 201 of the flexible display panel 2 includes a first inner bending section 203 and a second inner bending section 204. The first inner bending section 203 corresponds to the first sub-joint region 103, and a bending direction of the first inner bending section 203 is same as the bending direction of the first sub-joint region 103. The second inner bending section 204 corresponds to the second sub-joint region 104. A bending direction of the second inner bending section 204 is same as the bending direction of the second sub-joint region 104. The outer bending region 202 of the flexible display panel includes a first outer bending section 205, a second outer bending section 206, and a third outer bending section 207. The first outer bending section 205 corresponds to the third sub-joint region 105. A bending direction of the first outer bending section 205 is same as the bending direction of the third sub-joint region 105. The second outer bending section 206 corresponds to the fourth sub-joint region 106. A bending direction of the second outer bending section 206 is same as the bending direction of the fourth sub-joint region 106. The third outer bending section 207 corresponds to the semi-etching regions 101. A bending direction of the third outer bending section 207 is same as the bending direction of the semi-etching regions.

As illustrated in FIG. 7, when the foldable display module is in the completely folded state, in the bending direction, radii of curvature of the plurality of sub-joint regions corresponding to the inner bending region 201 gradually increase; radii of curvature of the plurality of sub-joint regions corresponding to the outer bending region 202 gradually increase; the radii of curvature of the sub-joint regions corresponding to the inner bending region 201 are less than the radii of curvature of the sub-joint regions corresponding to the outer bending region 202; and radii of curvature of the semi-etching regions 101 are greater than the radii of curvature of adjacent sub-joint regions. Therefore, the radius of curvature of the inner bending region 201 is gradually increased in the bending direction, and a level of bending of the inner bending region 201 is gradually reduced; and the radius of curvature of the outer bending region 202 is also gradually increased in the bending direction, and a level of bending of the outer bending region 201 is also gradually reduced. In this way, the arc of the flexible display panel 2 on the inner bending region 201 and the outer bending region 202 is made to be more continuous, and transition from the inner bending region 201 to the part of the flexible display panel 2 corresponding to the non-bending regions 11 is made to be smoother. In this way, the bending state of the flexible display panel 2 corresponding to the inner bending region 201 and the outer bending region 202 is changed, and sharp shapes as a result of bending on the part of the flexible display panel corresponding to the outer bending region 202 are prevented, thereby reducing the stress received by the part of the flexible display panel 2 corresponding to the outer bending region 202, thereby reducing the risk of film peeling of layers in the flexible display panel.

Furthermore, in the plurality of sub-joint regions corresponding to the inner bending region 201, radii of curvature of the sub-joint regions close to the semi-etching regions 101 are greater than or equal to radii of curvature of the sub-joint regions away from the semi-etching regions 101; and in the sub-joint regions corresponding to the outer bending regions 202, radii of curvature of the sub-joint regions close to the semi-etching regions 101 are greater than radii of curvature of the sub-joint regions away from the semi-etching regions 101.

In one embodiment of the present disclosure, as illustrated in FIG. 7, the radius R1 of curvature of the first sub-joint region 103 of the supporting plate is less than or equal to the radius R2 of curvature of the second sub-joint region 104; the radius R3 of curvature of the third sub-joint region 105 is less than the radius R4 of curvature of the fourth sub-joint region 106; and the radius R5 of curvature of the semi-etching regions 101 is greater the radius R4 of curvature of the fourth sub-joint region 106. It can be understood that in the flexible display panel 2, a radius of curvature of the first inner bending section 203 is less than or equal to a radius of curvature of the second inner bending section 204; a radius of curvature of the first outer bending section 205 is greater than the radius of curvature of the second inner bending section 204; and the radii of curvature the first outer bending section 205, the second outer bending section 206, and the third outer bending section 207 are in a trend of gradually increasing.

Specifically, please refer to FIG. 7. The radius of curvature R1 of the first sub-joint region 103 is 4 mm. The radius of curvature R2 of the second sub-joint region 104 is greater than or equal to 4 mm and less than or equal to 6 mm. The radius of curvature R3 of the third sub-joint region 105 is greater than or equal to 12 mm and less than or equal to 15 mm. The radius of curvature R4 of the fourth sub-joint region 106 is greater than or equal to 21 mm and less than or equal to 25 mm. The radius of curvature R5 of the semi-etching regions 101 is greater than or equal to 32 mm and less than or equal to 36 mm.

The flexible display panel module includes the protective layer 3. The protective layer 3 is disposed on a side of the supporting plate 1 away from the flexible display panel and at least covers the bending region 10 of the supporting plate 1.

The flexible display panel 2 includes a display substrate 21 and a display device layer 22, a polarizer sheet 23, an optical clear adhesive layer 24, and a module protective layer 25 sequentially laminated on the display substrate 21. Wherein, a material of the module protective layer 25 can be a transparent macromolecule material such as PET, etc., which has good optical properties and anti-wear properties, exerting effect of protecting the flexible display panel. The optical clear adhesive layer 24 is an adhesive with characteristics of being colorless and transparent, good luminous flux, high bonding strength, and small curing shrinkage, etc. The polarizer sheet 23 is a macromolecular thin film layer having characteristics of high polarization optical properties, high temperature, and humidity resistance, etc.

The flexible display panel further includes the buffer foam layer 4 disposed between the display substrate 21 and the supporting plate 1. The buffer foam layer 4 is made of an elastic material and has good effect of energy absorption and buffering.

The flexible display panel further includes at least one circular hole 26. The circular hole 26 penetrates the module protective layer 25, the optical clear adhesive layer 24, the polarizer sheet 23, the display device layer 22, the display substrate 21, and the supporting plate 1, and the circular hole 26 is defined on the non-bending regions 11 of the foldable display module. It can be understood that the circular hole 26 can be but is not limited to a camera hole.

The foldable display module provided by the embodiments of the present application can be applied but not limited to the field of foldable display, which can also be applied to the fields of rollable display, large-screen display, or expandable display, and tablet phones, flexible foldable phones, full-screen mobile phones, tablet computers, and can also be used in rollable phones, or rollable tablet computers, and can also be used in various flexible electronic equipment.

In summary, embodiments of the present disclosure provide the supporting plate and the foldable display module. The supporting plate is configured to support the flexible display panel. The supporting plate has at least one bending region and the plurality of non-bending regions. Each bending region is connected between two opposite non-bending regions. The bending regions include the joint regions and the two semi-etching regions. The joint regions have the symmetrically central line. The plurality of hollow structures in strip shapes penetrating the supporting plate are defined on the part where the supporting plate corresponds to the joint regions. The joint regions located on any side of the symmetrically central line include the plurality of sub-joint regions arranged sequentially along a direction away from the symmetrically central line. At least one of sizes of the hollow structures in the different sub-joint regions, distances between adjacent hollow structures in a direction parallel to the symmetrically central line, or distances between the hollow structures close to the supporting plate and at an edge of any side perpendicular to the symmetrically central line and an edge of a corresponding side on the supporting plate are different. Controlling at least one of the size of the hollow structures in the joint region, the distance from the edge of the supporting plate, and the distance between adjacent hollow structures by the above, the elastic tensile modulus of each sub-joint region presents regional changes. Therefore, the bending ductility and fatigue resistance of the part of the supporting plate corresponding to the joint region is improved, and difference in the radius of curvature of each sub-joint region in the completely folded state of the supporting plate is reduced, so that the overall arc of the joint region is more continuous, and the transition of each sub-joint region is made to be smooth. The two semi-etching regions are respectively disposed between the joint regions and the two opposite non-bending regions. The plurality of groove structures not penetrating the supporting plate are defined on a lateral surface of a part of the supporting plate corresponding to the semi-etching regions. By defining the plurality of groove structures in the semi-etching regions, the bending modulus of the part of the supporting plate corresponding to the semi-etching regions is less than the bending modulus of the part of the supporting plate corresponding to the joint regions, thereby reducing difference between the radius of curvature of the part of the supporting plate corresponding to the semi-etching regions in the completely folded state and the radius of curvature of the adjacent sub-joint regions, making the arc of the part corresponding from the joint regions to the semi-etching regions of the supporting plate more continuous and transition on the supporting plate from the joint region to the non-bending region smoother. Therefore, the received stress of the part the flexible display panel corresponding to the semi-etching regions is reduced, and the risk of films peeling in the semi-etching regions of the foldable display module is reduced.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

The invention claimed is:

1. A supporting plate configured to support a flexible display panel, wherein the supporting plate has at least one bending region and non-bending regions connected to the bending region, each bending region is connected between two opposite non-bending regions, wherein the bending region comprises:
joint regions, wherein the joint regions have a symmetrically central line; a plurality hollow structures in strip shapes penetrating the supporting plate are defined on a part where the supporting plate corresponds to the joint regions; wherein
the joint regions located on any side of the symmetrically central line comprise a plurality of sub-joint regions arranged sequentially along a direction away from the symmetrically central line; and
at least one of sizes of the hollow structures in the different sub-joint regions, distances between adjacent hollow structures in a direction parallel to the symmetrically central line, or distances between the hollow structures close to the supporting plate and at an edge of any side perpendicular to the symmetrically central line and an edge of a corresponding side on the supporting plate are different; and
two semi-etching regions respectively disposed between the joint regions and the two opposite non-bending regions, wherein a plurality of groove structures not penetrating the supporting plate in a thickness direction of the supporting plate are defined on a lateral surface of a part of the supporting plate corresponding to the semi-etching regions;
wherein each of the plurality of groove structures runs through the supporting plate from an edge of a side of the supporting plate perpendicular to the symmetrically central line to an edge on other opposite side.

2. The supporting plate as claimed in claim 1, wherein a length direction of the hollow structures is parallel to the symmetrically central line; a width direction of the plurality of hollow structures is perpendicular to the symmetrically central line;
at least two adjacent hollow structures are defined side by side in the direction parallel to the symmetrically central line; and
two adjacent hollow structures are defined in a staggered manner in a direction perpendicular to the symmetrically central line.

3. The supporting plate as claimed in claim 2, wherein the hollow structures comprise:
a plurality of middle hollow structures defined between the supporting plate and two opposite lateral edges perpendicular to the symmetrically central line; and
a plurality of edge hollow structures defined on a side of edges of part of the middle hollow structures close to the supporting plate and perpendicular to the symmetrically central line and penetrating an edge of the supporting plate in a thickness direction of the supporting plate.

4. The supporting plate as claimed in claim 3, wherein in any two adjacent sub-joint regions located on a same side of the symmetrically central line, lengths of the middle hollow structures in the sub-joint regions close to the symmetrically central line are greater than lengths of the plurality of middle hollow structures in the sub-joint region away from the symmetrically central line.

5. The supporting plate as claimed in claim 4, wherein ratios between the lengths of the middle hollow structures located in any two adjacent sub-joint regions of the same side are greater than or equal to 2 and less than or equal to 3.

6. The supporting plate as claimed in claim 3, wherein lengths of the plurality of middle hollow structures in one same sub-joint region are same.

7. The supporting plate as claimed in claim 3, wherein in the direction parallel to the symmetrically central line, lengths of the edge hollow structures are greater than or equal to lengths of adjacent middle hollow structures, wherein in any two adjacent sub-joint regions located on a same side of the symmetrically central line, the lengths of the plurality of edge hollow structures in the sub-joint region close to the symmetrically central line are greater than or equal to the lengths of the plurality of edge hollow structures in the sub-joint region away from the symmetrically central line, and wherein the joint regions located on any side of the symmetrically central line comprise a first sub-joint region, a second sub-joint region, a third sub-joint region, and a fourth sub-joint region sequentially arranged along the direction away from the symmetrically central line, wherein:

the lengths of the edge hollow structures are equal to the lengths of the middle hollow structures in the first sub-joint region;

the ratios of the lengths of the edge hollow structures to the lengths of the middle hollow structures are 2 in the second sub-joint region;

the ratios of the lengths of the edge hollow structures to the lengths of the middle hollow structures are 2 in the third sub-joint region; and the ratios of the lengths of the edge hollow structures to the lengths of the middle hollow structures are greater than or equal to 4 and less than or equal to 4.5 in the fourth sub-joint region.

8. The supporting plate as claimed in claim 3, wherein separation distances of any two hollow structures are equal in the direction parallel to the symmetrically central line, and wherein the separation distances of any two adjacent hollow structures are greater than or equal to 0.16 mm and less than or equal to 0.25 mm in the direction parallel to the symmetrically central line.

9. The supporting plate as claimed in claim 3, wherein in any two adjacent sub-joint regions located on a same side of the symmetrically central line, a distance between the middle hollow structure in the sub-joint regions close to the symmetrically central line and an edge of the supporting plate is longer than or equal to a distance between the middle hollow structure in the sub-joint regions away from the symmetrically central line and the edge of the supporting plate.

10. The supporting plate as claimed in claim 1, wherein depths of the groove structures located on a same side of the symmetrically central line gradually reduce in the direction away from the symmetrically central line.

11. The supporting plate as claimed in claim 10, ratios between the depths of any two adjacent groove structures are greater than or equal to 1.2 and less than or equal to 1.5 in the direction away from the symmetrically central line.

12. The supporting plate as claimed in claim 10, wherein ratios of depths of the plurality of groove structures to a thickness of the supporting plate are less than or equal to 0.6.

13. The supporting plate as claimed in claim 1, wherein in the direction away from the symmetrically central line, widths of the groove structures in the direction perpendicular to the symmetrically central line on a same side of the symmetrically central line are equal or gradually decreases.

14. The supporting plate as claimed in claim 13, wherein in the direction away from the symmetrically central line, ratios between the widths of any two adjacent groove structures in the direction perpendicular to the symmetrically central line are greater than or equal to 1 and less than or equal to 2, wherein in the direction away from the symmetrically central line, distances between two adjacent groove structures are same or are gradually decreased, and wherein in the direction away from the symmetrically central line, ratios of the distances between two adjacent groove structures are greater than or equal to 1 and less than or equal to 1.5.

15. A foldable display module, comprising a flexible display panel; and a supporting plate disposed on a backside of the flexible display panel, wherein the supporting plate has at least one bending region and non-bending regions connected to the bending region, each bending region is connected between two opposite non-bending regions, wherein the bending regions comprise joint regions, wherein the joint regions have a symmetrically central line; a plurality hollow structures in strip shapes penetrating the supporting plate are defined on a part where the supporting plate corresponds to the joint regions, the joint regions located on any side of the symmetrically central line comprise a plurality of sub-joint regions arranged sequentially along a direction away from the symmetrically central line; and at least one of sizes of the hollow structures in the different sub-joint regions, distances between adjacent hollow structures in a direction parallel to the symmetrically central line, or distances between the hollow structures close to the supporting plate and at an edge of any side perpendicular to the symmetrically central line and an edge of a corresponding side on the supporting plate are different; and two semi-etching regions respectively disposed between the joint regions and two opposite non-bending regions, wherein a plurality of groove structures not penetrating the supporting plate are defined on a lateral surface of a part of the supporting plate corresponding to the semi-etching regions, and wherein when the foldable flexible display panel is in a completely folded state, a part of the flexible display panel corresponding to the bending region forms a bending structure in a teardrop shape perpendicular to a cross section of the symmetrically central line;

the bending structure comprises an inner bending region and outer bending regions; the outer bending regions are located on two sides of the inner bending region and are connected to a part of the flexible display panel corresponding to the non-bending regions;

a part of the supporting plate corresponding to the inner bending region comprises the sub-joint regions away from the semi-etching region; and a part of the supporting plate corresponding to the outer bending regions comprises the sub-joint regions close to the semi-etching regions and the semi-etching regions;

wherein a length direction of the plurality of hollow structures is parallel to the symmetrically central line; a width direction of the hollow structures is perpendicular to the symmetrically central line;

at least two adjacent hollow structures are defined side by side in a direction parallel to the symmetrically central line; and two adjacent hollow structures are defined in a staggered manner in the direction perpendicular to the symmetrically central line, wherein the hollow structures comprise:

a plurality of middle hollow structures disposed between the supporting plate and two opposite lateral edges perpendicular to the symmetrically central line; and a plurality of edge hollow structures disposed on a side of edges of part of the middle hollow structures close to the supporting plate and perpendicular to the symmetrically central line and penetrating an edge of the supporting plate in a thickness direction of the supporting plate, wherein in the direction parallel to the symmetrically central line, lengths of the edge hollow structures are greater than or equal to lengths of adjacent middle hollow structures, wherein in any two adjacent sub-joint regions located on a same side of the symmetrically central line, the lengths of the plurality of edge hollow structures in the sub-joint region close to the symmetrically central line are greater than or equal to the lengths of the plurality of edge hollow structures in the sub-joint region away from the symmetrically central line, and wherein the joint regions located on any side of the symmetrically central line comprise a first sub-joint region, a second sub-joint region, a third sub-joint region, and a fourth sub-joint region sequentially arranged along the direction away from the symmetrically central line, wherein:

the lengths of the edge hollow structures are equal to the lengths of the middle hollow structures in the first sub-joint region;

the ratios of the lengths of the edge hollow structures to the lengths of the middle hollow structures are 2 in the second sub-joint region;

the ratios of the lengths of the edge hollow structures to the lengths of the middle hollow structures are 2 in the third sub-joint region; and the ratios of the lengths of the edge hollow structures to the lengths of the middle hollow structures are greater than or equal to 4 and less than or equal to 4.5 in the fourth sub-joint region.

16. The foldable display module as claimed in claim 15, wherein when the foldable flexible display panel is in the completely folded state, in the sub-joint regions corresponding to the inner bending region, radii of curvature of the sub-joint regions close to the semi-etching regions are greater than or equal to radii of curvature of the sub-joint regions away from the semi-etching regions; and in the plurality of sub-joint regions corresponding to the outer bending regions, radii of curvature of the sub-joint regions close to the semi-etching regions are greater than radii of curvature of the sub-joint regions away from the semi-etching regions.

17. The foldable display module as claimed in claim 16, wherein the inner bending region comprises a first inner bending section and a second inner bending section; the outer bending regions comprise first outer bending sections, second outer bending sections, and third outer bending sections; the first inner bending section and the second inner bending section correspond to the first sub-joint region and the second sub-joint region one-to-one respectively; the first outer bending sections, the second outer bending sections, and the third outer bending sections respectively correspond to the third sub-joint region, the fourth sub-joint region, and the semi-etching regions one-to-one respectively; wherein a radius of curvature of the first sub-joint region is 4 mm;

a radius of curvature of the second sub-joint region is greater than or equal to 4 mm and less than or equal to 6 mm;

a radius of curvature of the third sub-joint region is greater than or equal to 12 mm and less than or equal to 15 mm;

a radius of curvature of the fourth sub-joint region is greater than or equal to 21 mm and less than or equal to 25 mm; and radii of curvature of the semi-etching regions are greater than or equal to 32 mm and less than or equal to 36 mm.

18. The foldable display module as claimed in claim 17, wherein the foldable display module comprises a buffer foam layer disposed between the flexible display panel and the supporting plate, and a protective layer disposed on a side of the supporting plate away from the flexible display panel and at least covering the bending region, wherein the flexible display panel comprises a display substrate and a display device layer, a polarizer sheet, an optical clear adhesive layer, and a module protective layer sequentially laminated on the display substrate.

* * * * *